(12) United States Patent
Avraham et al.

(10) Patent No.: US 8,056,794 B2
(45) Date of Patent: Nov. 15, 2011

(54) COMBINATION WEDGE BONDING AND BALL BONDING TRANSDUCER

(75) Inventors: Lea Avraham, Kiriat Ata (IL); Beni Nachon, Qiriat-Ata (IL); Joseph M. Martin, Warminster, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 606 days.

(21) Appl. No.: 11/868,583

(22) Filed: Oct. 8, 2007

(65) Prior Publication Data

US 2008/0083814 A1 Apr. 10, 2008

Related U.S. Application Data

(60) Provisional application No. 60/828,676, filed on Oct. 9, 2006.

(51) Int. Cl.
*B23K 20/10* (2006.01)
(52) U.S. Cl. .......................... 228/4.5; 228/1.1; 228/180.5
(58) Field of Classification Search .................... 228/1.1, 228/4.5, 110.1
See application file for complete search history.

(56) References Cited

U.S. PATENT DOCUMENTS 6,135,338 A * 10/2000 Kyomasu et al. ............. 228/1.1
2003/0062395 A1* 4/2003 Li et al. ......................... 228/4.5

FOREIGN PATENT DOCUMENTS

IL  102112 A  *  5/1996

OTHER PUBLICATIONS

Model 626 Mulipurpose Digital Thermosonic Wire Bonder, Ball Bonder, Wedge Bonder, Bump Bonder, Peg Bonder and more. Hybond, Inc., Model 626 (http://www.hybond.com/pdf/626.pdf).
"4524 Ball Bonder" brochure. (http://www.kns.com/KNSNew/Templates/ShowPage.asp?TMID=108&FID=853&PID=3811) 2001, Kulicke and Soffa Industries, Inc.
West Bond Inc. 7400E-7600E-7700E Series, Manual Wire Bonders, Triple Convertible Machine. (http://www.westbond.com/fl_products.htm).
TPT, HB05, Wedge and Ball Bonder. (http://tpt.de/HB05_englisch.pdf).
"4700 Convertible Wire Bonder" Brochure. (http://kns.com/KNSNew/Templates/ShowPage.asp?TMID=86&FID=853&PID=14872) 2007, Kulicke and Soffa Industries, Inc.

* cited by examiner

*Primary Examiner* — Jessica L Ward
*Assistant Examiner* — Nicholas D'Aniello
(74) *Attorney, Agent, or Firm* — Christopher M. Spletzer, Sr.

(57) ABSTRACT

A transducer configured for use with a manual wire bonding machine includes a body portion including an end portion, the end portion defining a bonding tool aperture configured to receive at least a portion of a bonding tool. The transducer also includes a first tightening mechanism for securing a ball bonding tool in the bonding tool aperture, and a second tightening mechanism for securing a wedge bonding tool in the bonding tool aperture. The first tightening mechanism is distinct from the second tightening mechanism.

19 Claims, 6 Drawing Sheets

COMBINATION WEDGE BONDING AND BALL BONDING TRANSDUCER

CROSS-REFERENCE TO RELATED APPLICATION

This application claims the benefit of U.S. Provisional Application No. 60/828,676, filed Oct. 9, 2006, the contents of which are incorporated herein by reference.

FIELD OF THE INVENTION

The present invention relates to manual wire bonding machines, and more particularly, to a transducer for manual wire bonding machines configured for ball bonding and wedge bonding.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

Manual wire bonding machines (in contrast to automatic wire bonding machines) are often purchased by low volume users, for example: universities, research and development teams, product development teams, etc. Therefore, it is often desirable that each such wire bonding machine be adaptable for as many variables as possible.

In particular, it is desirable that certain manual wire bonding machines be adaptable for use as a ball bonding machine or as a wedge bonding machine. In order for this to occur, a transducer (e.g., an ultrasonic transducer) configured to hold both a ball bonding tool (i.e., a capillary tool) and a wedge bonding tool (e.g., a wedge tool) would be desirably provided.

As is known to those skilled in the art, when a bonding tool is connected to a transducer for bonding it is tightened, for example, using a screw mechanism or the like. More specifically, the tool is partially inserted into an aperture defined by the transducer, and a screw mechanism or the like is tightened to properly secure the tool. Unfortunately, the tightening mechanism (e.g., the screw mechanism) is more properly configured to secure only one type of tool. For example, in a transducer configured for ball bonding, one conventional design is to use a split clamp aperture to receive the bonding tool, wherein a screw is provided on a side of the transducer adjacent the bonding tool aperture, whereby the screw tightens the split clamp aperture around the bonding tool; however, such an arrangement is not desired for wedge bonding because, for example, the wedge bonding tool is not automatically aligned by such an arrangement (amongst other reasons). Likewise, in a transducer configured for wedge bonding, one conventional design is to use a screw provided on a front tip portion of the transducer, whereby the screw tightens against a flat surface of the wedge bonding tool; however, such an arrangement is not desired for ball bonding because, for example, the screw may damage (and even break) the curved surface of the ball bonding tool.

Thus, it would be desirable to provide an improved transducer that accommodates both ball bonding and wedge bonding.

SUMMARY OF THE INVENTION

According to an exemplary embodiment of the present invention, a transducer configured for use with a manual wire bonding machine is provided. The transducer includes a body portion including an end portion, the end portion defining a bonding tool aperture configured to receive at least a portion of a bonding tool. The transducer also includes a first tightening mechanism for securing a ball bonding tool in the bonding tool aperture, and a second tightening mechanism for securing a wedge bonding tool in the bonding tool aperture. The first tightening mechanism is distinct from the second tightening mechanism.

According to another exemplary embodiment of the present invention, a transducer configured for use with a manual wire bonding machine is provided. The transducer includes a body portion including an end portion, the end portion defining a bonding tool aperture configured to receive at least a portion of a bonding tool. The end portion also defines a second aperture on a side of the end portion, the second aperture configured to receive a first tightening mechanism for securing a ball bonding tool in the bonding tool aperture. The end portion also defines a third aperture on a front tip of the end portion, the third aperture configured to receive a second tightening mechanism for securing a wedge bonding tool in the bonding tool aperture.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

According to certain exemplary embodiments of the present invention, a transducer is provided (e.g., a transducer for 60 kHz or other frequency wire bonding). The transducer is designed to provide correct mounting for ball bonding (capillary tools) and wedge bonding (wedge bond tools). The transducer assembly includes mounting features for both ball bonding tools and wedge bonding tools.

Referring now to FIGS. 1A-1B, 2A-2B, and 3A-3B, various views are provided of transducer 100 holding ball bonding capillary tool 110. In contrast, referring to FIGS. 4A-4B, 5A-5B, and 6A-6B, various views are provided of transducer 100 holding wedge bonding tool 120.

Figure 1A:
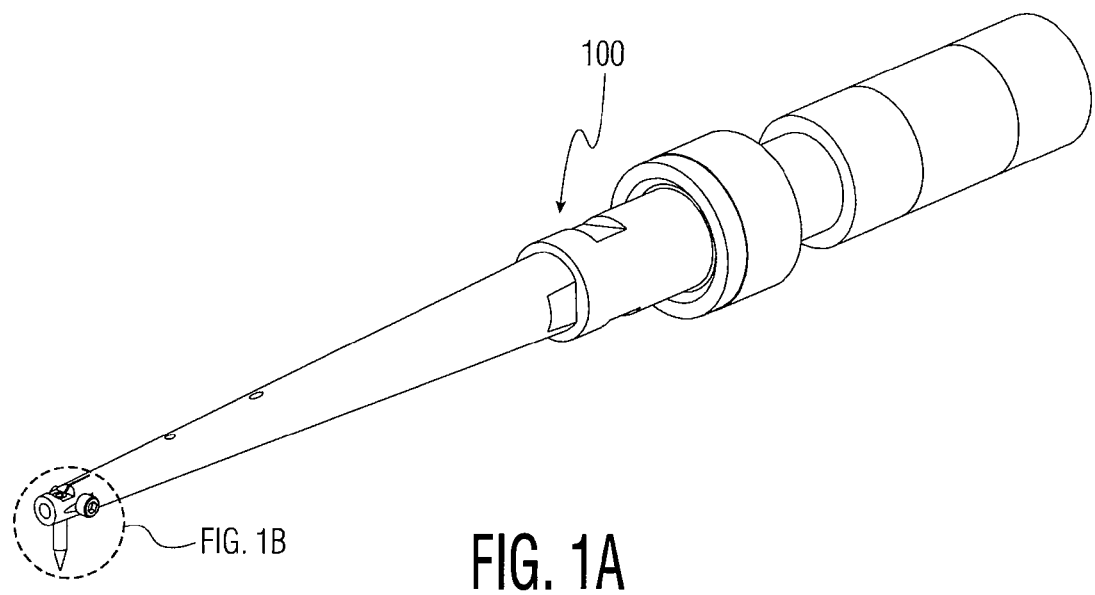
FIG. 1A is a perspective view of a transducer holding a ball bonding capillary tool in accordance with an exemplary embodiment of the present invention.
Figure 1B:
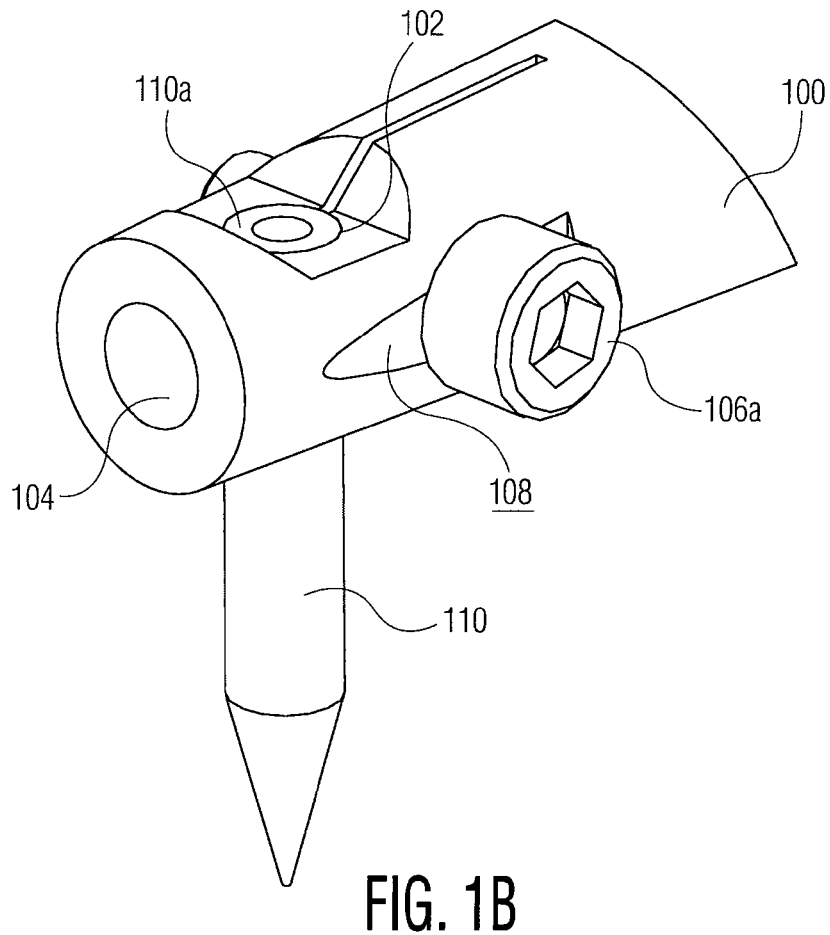
FIG. 1B is a detailed view of a portion of FIG. 1A.

Referring specifically to the perspective views provided in FIGS. 1A-1B, transducer 100 includes an end portion that is shown in the detailed view of FIG. 1B. As shown in FIG. 1B, first tightening mechanism 106a (e.g., a threaded screw member or the like) is used secure ball bonding capillary tool 110 within bonding tool aperture 102 defined by the end portion of transducer 100. Top surface 110a of ball bonding capillary tool 110 is visible in FIG. 1B. As is clear from FIG. 1B (and also FIG. 2B), surface 108 of the end portion is shaped (e.g., is relatively flat) such that a head portion of first tightening mechanism 106a can bear against surface 108 when securely inserted therein. Also shown in the end portion of transducer 100 is third aperture 104 configured to receive second tightening mechanism 104a (shown in FIGS. 4A-4B, 5A-5B, and 6A-6B).

Figure 2A:
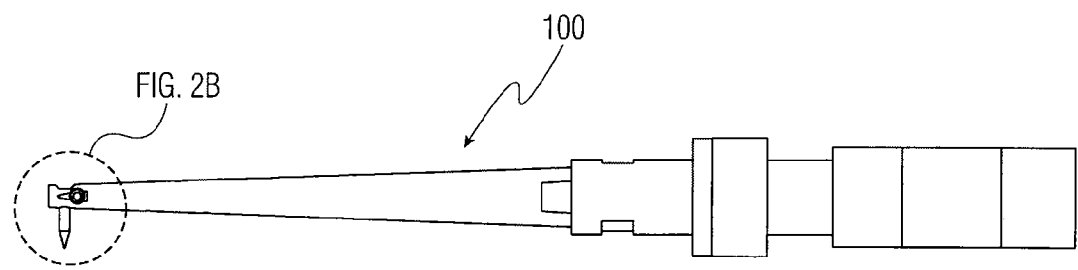
FIG. 2A is a side view of a transducer holding a ball bonding capillary tool in accordance with an exemplary embodiment of the present invention.
Figure 2B:
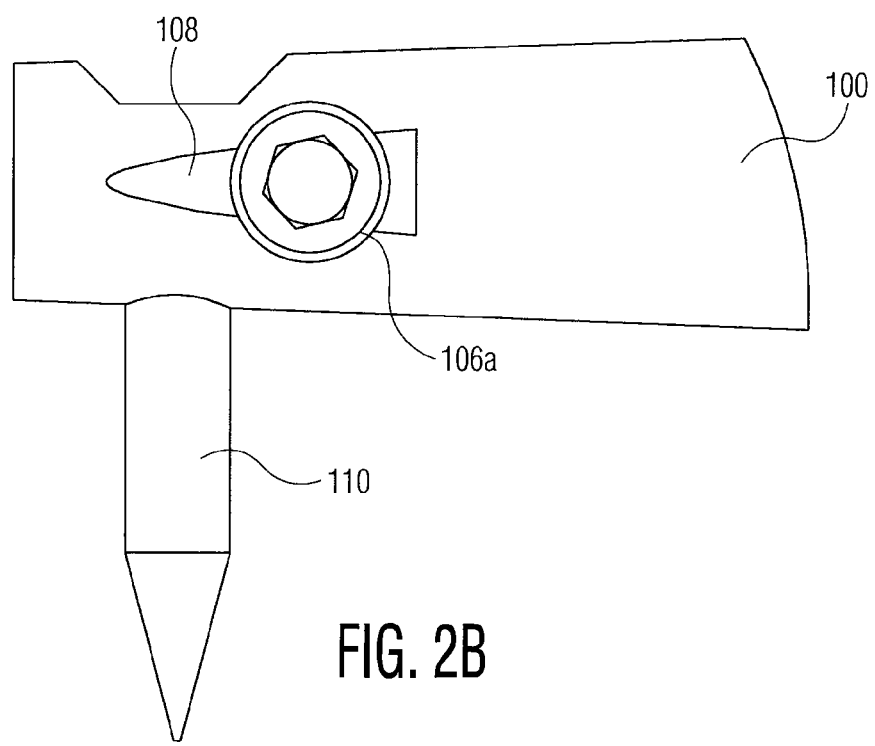
FIG. 2B is a detailed view of a portion of FIG. 2A.
Figure 3A:
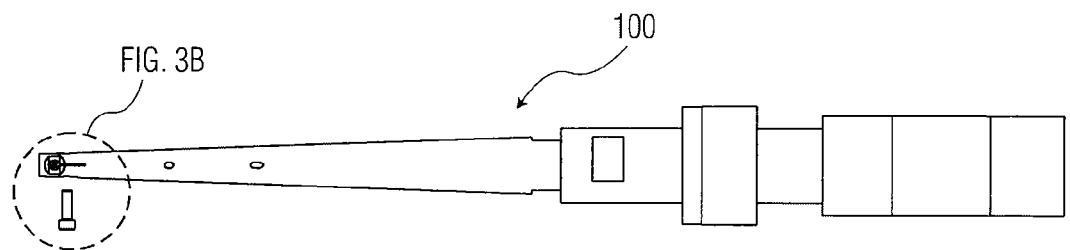
FIG. 3A is a top view of a transducer holding a ball bonding capillary tool in accordance with an exemplary embodiment of the present invention.
Figure 3B:
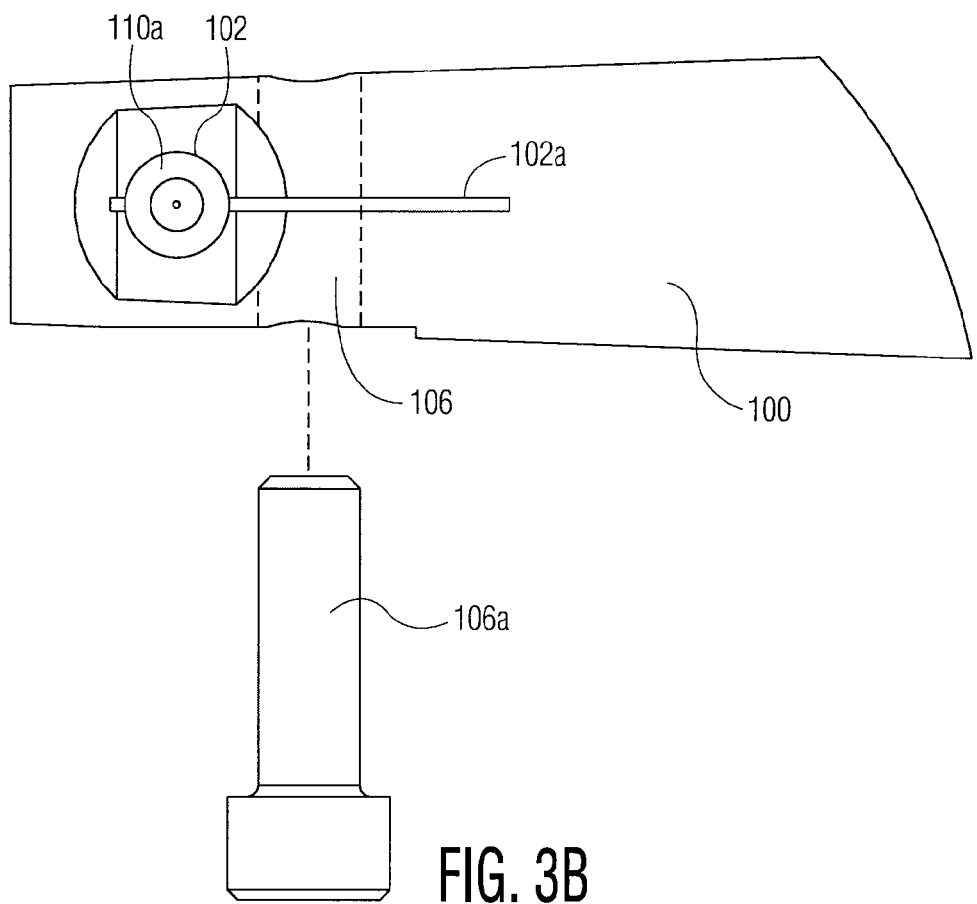
FIG. 3B is a detailed view of a portion of FIG. 3A.

FIGS. 2A-2B are side views of transducer 100, and the end portion of transducer 100, respectively, engaged with ball bonding capillary tool 110. FIGS. 3A-3B are top views of transducer 100, and the end portion of transducer 100, respectively (with first tightening mechanism 106a removed from second aperture 106). As is shown more clearly in FIG. 3B, aperture 102 is "a key-hole aperture" (also known as a "split clamp aperture" or a "C clamp aperture") and includes linear portion 102a. When first tightening mechanism 106a is securely inserted into second aperture 106 (e.g., where second aperture 106 may be threaded), bonding tool aperture 102 tightens around ball bonding capillary tool 110 to secure ball bonding capillary tool 110 in position.

Figure 4A:
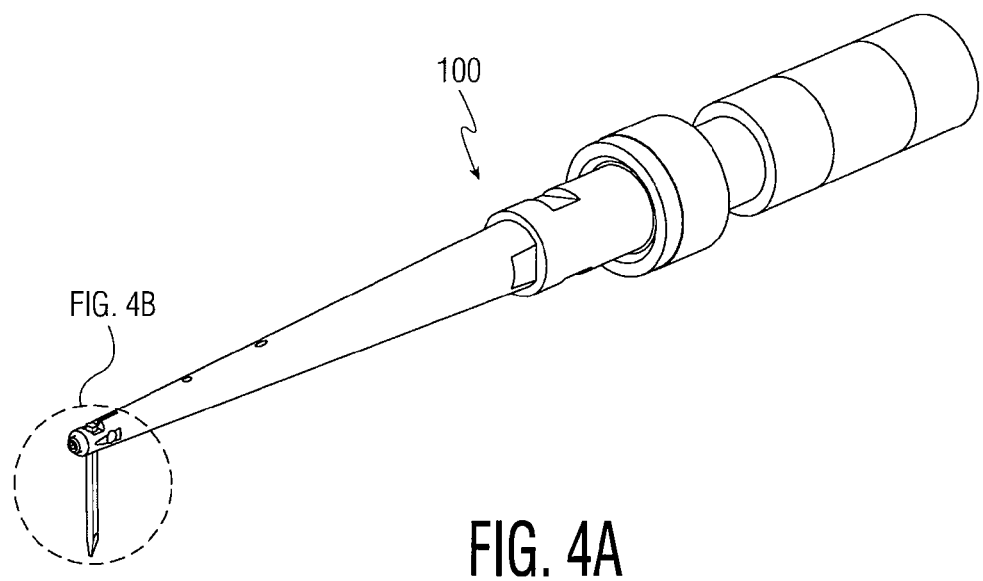
FIG. 4A is a perspective view of a transducer holding a wedge bonding tool in accordance with an exemplary embodiment of the present invention.
Figure 4B:
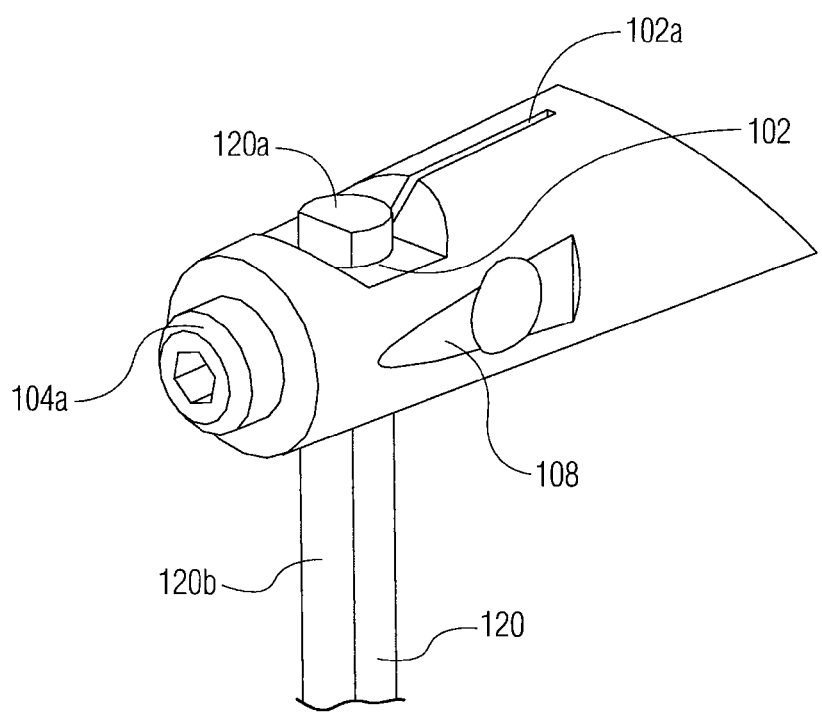
FIG. 4B is a detailed view of a portion of FIG. 4A.

Referring now to the perspective views provided in FIGS. 4A-4B, second tightening mechanism 104a (e.g., a threaded screw member or the like) is used to secure wedge bonding tool 120 within bonding tool aperture 102. Top surface 120a of wedge bonding tool 120 is visible in FIG. 4B. As is clear from FIG. 4B (and also FIG. 5B), surface 120b of wedge bonding tool 120 is shaped (e.g., is relatively flat) such that when second tightening mechanism 104a is securely inserted into third aperture 104 (e.g., where third aperture 104 may be threaded), a tip of second tightening mechanism can bear against surface 120b. Also shown in the end portion of transducer 100 in FIG. 4B is second aperture 106 configured to receive first tightening mechanism 106a when ball bonding tool 110 is selected (as in FIGS. 1A-1B, 2A-2B, and 3A-3B).

Figure 5A:
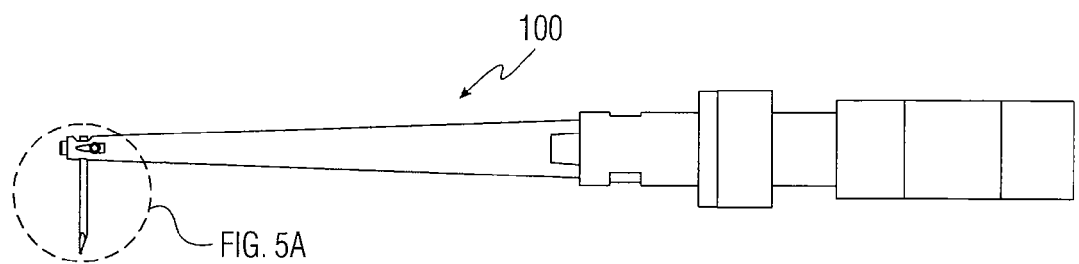
FIG. 5A is a side view of a transducer holding a wedge bonding tool in accordance with an exemplary embodiment of the present invention.
Figure 5B:
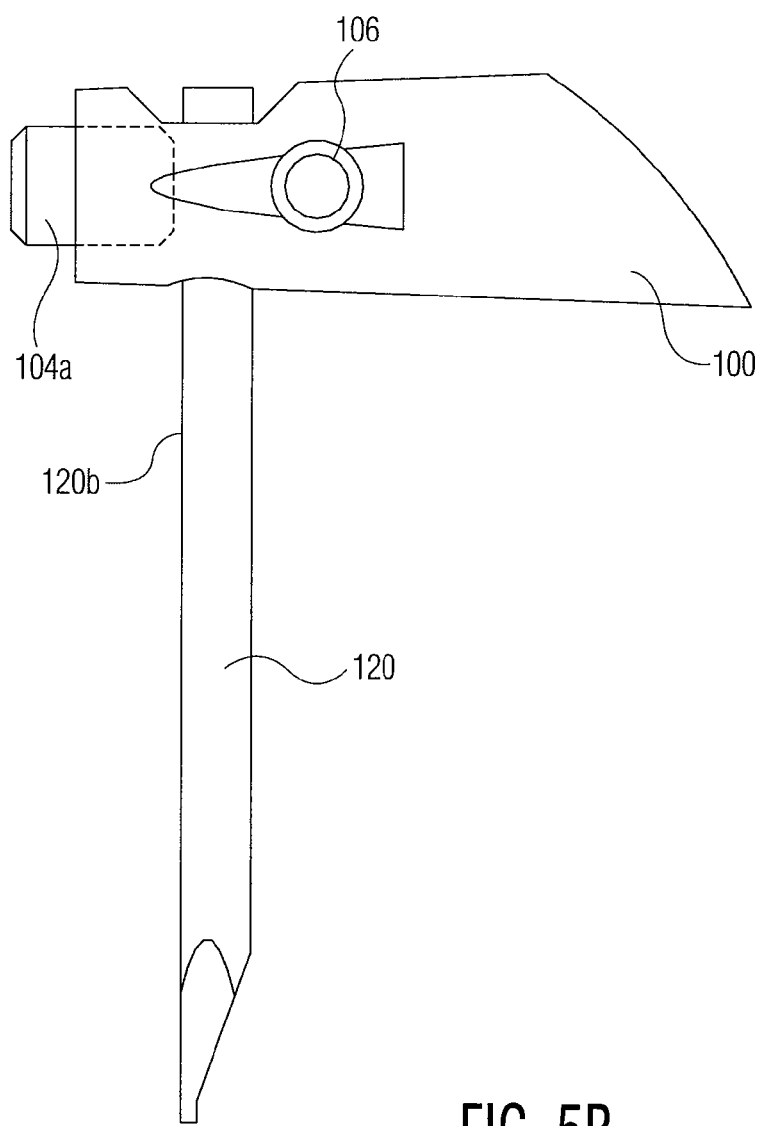
FIG. 5B is a detailed view of a portion of FIG. 5A.
Figure 6A:
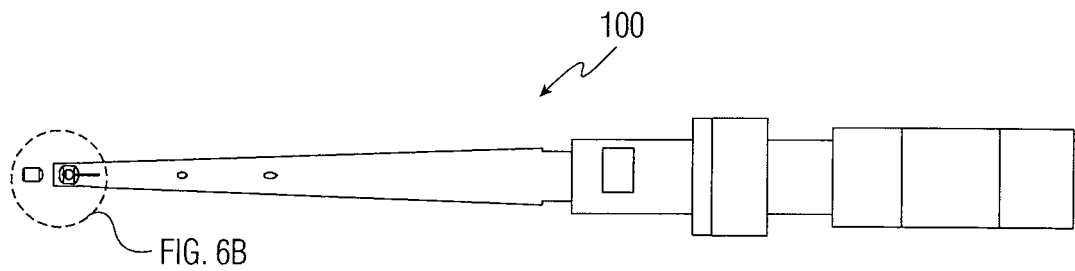
FIG. 6A is a top view of a transducer holding a wedge bonding tool in accordance with an exemplary embodiment of the present invention.
Figure 6B:
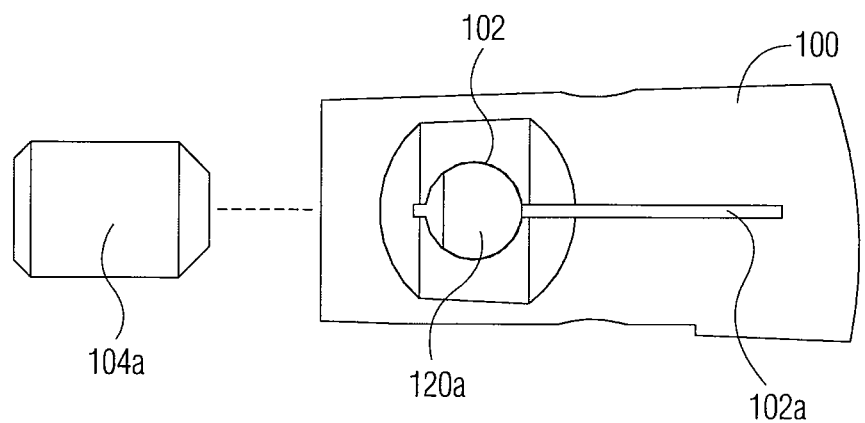
FIG. 6B is a detailed view of a portion of FIG. 6A.

FIGS. 5A-5B are side views of transducer 100, and the end portion of transducer 100, respectively, engaged with wedge bonding tool 120. FIGS. 6A-6B are top views of transducer 100, and the end portion of transducer 100, respectively (with second tightening mechanism 104a removed from third aperture 104).

Thus, according to the illustrated exemplary embodiments of the present invention, third aperture 104 (and second tightening mechanism 104a) is provided at the front tip of the end portion of transducer 100, while second aperture 106 (and first tightening mechanism 106a) is provided at the side of the end portion of transducer 100. As such, transducer 100 is configured to properly support and secure both ball bonding capillary tools and wedge bonding tools, providing a significant benefit over conventional transducers. This is especially beneficial because when energy is supplied to the respective bonding tool via the transducer (e.g., ultrasonic energy), a secure fit between the selected bonding tool and the bonding tool aperture is very desirable.

Although the present invention has been illustrated and described with respect to a third aperture on a front tip of the end portion, and a second aperture on a side of the end portion, it is not limited thereto. Any of a number of alternative locations and shapes may be selected for the apertures. Further, the apertures are not limited to the types of apertures described herein (i.e., a split clamp bonding tool aperture, threaded second and third apertures, etc.). Likewise, alternative tightening mechanisms (i.e., other than threaded screw members) may also be provided.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A transducer configured for use with a manual wire bonding machine, the transducer comprising:
   a conically shaped ultrasonic transducer body portion including a distal end portion, the distal end portion defining a bonding tool aperture configured to receive at least a portion of a bonding tool;
   a first tightening mechanism for securing a ball bonding tool in the bonding tool aperture;
   a second aperture defined by the distal end portion, the second aperture receiving the first tightening mechanism for securing the ball bonding tool in the bonding tool aperture; and
   a third aperture defined by the distal end portion, the third aperture being a threaded aperture and being distinct from the second aperture, the third aperture being substantially round and extending from the distal end portion to the bonding tool aperture and terminating within the bonding tool aperture, the third aperture extending in a direction substantially perpendicular to (1) a lengthwise direction of the bonding tool aperture and (2) a lengthwise direction of the second aperture, the third aperture being configured to receive a second tightening mechanism for securing a wedge bonding tool in the bonding tool aperture, wherein when the third aperture receives the second tightening mechanism a distal end of the second tightening mechanism bears against a surface of the wedge bonding tool.

2. The transducer of claim 1 wherein the first tightening mechanism is received by the second aperture on a side of the distal end portion.

3. The transducer of claim 2 wherein when the first tightening mechanism is securely inserted into the second aperture the bonding tool aperture tightens around the ball bonding tool.

4. The transducer of claim 3 wherein the bonding tool aperture is a split clamp aperture configured to tighten around the ball bonding tool when the first tightening mechanism is securely inserted into the second aperture.

5. The transducer of claim 2 wherein the second aperture is a threaded aperture and the first tightening mechanism is a threaded screw member.

6. The transducer of claim 1 wherein the second tightening mechanism is configured to be received by the third aperture on a front tip of the distal end portion.

7. The transducer of claim 6 wherein when the second tightening mechanism is securely inserted into the third aperture, the second tightening mechanism contacts the wedge bonding tool.

8. The transducer of claim 6 wherein the second tightening mechanism is a threaded screw member.

9. The transducer of claim 1 wherein at least one of the first tightening mechanism and the second tightening mechanism is a threaded screw member.

10. A transducer configured for use with a manual wire bonding machine, the transducer comprising:
- a conically shaped ultrasonic transducer body portion including a distal end portion, the distal end portion defining a bonding tool aperture configured to receive at least a portion of a bonding tool,
- the distal end portion also defining a second aperture on a side of the distal end portion,
- a first tightening mechanism received by the second aperture for securing a ball bonding tool in the bonding tool aperture, and
- the distal end portion also defining a third aperture on a front tip of the distal end portion, the third aperture being a threaded aperture and being distinct from the second aperture, the third aperture configured to receive a second tightening mechanism for securing a wedge bonding tool in the bonding tool aperture, the third aperture being substantially round and extending from the distal end portion to the bonding tool aperture and terminating within the bonding tool aperture, the third aperture extending in a direction substantially perpendicular to (1) a lengthwise direction of the bonding tool aperture and (2) a lengthwise direction of the second aperture, wherein when the third aperture receives the second tightening mechanism a distal end of the second tightening mechanism bears against a surface of the wedge bonding tool.

11. The transducer of claim 10 wherein when the first tightening mechanism is securely inserted into the second aperture the bonding tool aperture tightens around the ball bonding tool.

12. The transducer of claim 11 wherein the bonding tool aperture is a split clamp aperture configured to tighten around the ball bonding tool when the first tightening mechanism is securely inserted into the second aperture.

13. The transducer of claim 10 wherein the second aperture is a threaded aperture and the first tightening mechanism is a threaded screw member.

14. The transducer of claim 10 wherein when the second tightening mechanism is securely inserted into the third aperture, the second tightening mechanism contacts the wedge bonding tool.

15. The transducer of claim 10 wherein the second tightening mechanism is a threaded screw member.

16. The transducer of claim 10 wherein at least one of the first tightening mechanism and the second tightening mechanism is a threaded screw member.

17. The transducer of claim 1 wherein when the second tightening mechanism is securely inserted in the third aperture, a portion of the second tightening mechanism extends into the bonding tool aperture to secure the wedge bonding tool in the bonding tool aperture.

18. The transducer of claim 10 wherein when the second tightening mechanism is securely inserted in the third aperture, a portion of the second tightening mechanism extends into the bonding tool aperture to secure the wedge bonding tool in the bonding tool aperture.

19. The transducer of claim 10 wherein when the second tightening mechanism is securely inserted into the third aperture, the second tightening mechanism contacts a flat side surface of the wedge bonding tool.

* * * * *